United States Patent
Chiang et al.

(10) Patent No.: US 8,116,424 B2
(45) Date of Patent: Feb. 14, 2012

(54) SHIFT REGISTER AND LIQUID CRYSTAL DISPLAY USING SAME

(75) Inventors: Chien-Hsueh Chiang, Miao-Li (TW); Sz-Hsiao Chen, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 728 days.

(21) Appl. No.: 12/283,816

(22) Filed: Sep. 15, 2008

(65) Prior Publication Data

US 2009/0073105 A1   Mar. 19, 2009

(30) Foreign Application Priority Data

Sep. 14, 2007  (CN) .......................... 2007 1 0077108

(51) Int. Cl.
  *G11C 19/00*    (2006.01)
(52) U.S. Cl. ................ 377/64; 377/72; 377/73; 377/74; 377/78; 377/79
(58) Field of Classification Search ........................ None
  See application file for complete search history.

(56) References Cited

U.S. PATENT DOCUMENTS

| | | | |
|---|---|---|---|
| 6,611,248 B2 * | 8/2003 | Kanbara et al. ............... | 345/100 |
| 6,970,530 B1 * | 11/2005 | Wang et al. ..................... | 377/69 |
| 7,027,550 B2 | 4/2006 | Lin | |
| 7,038,653 B2 * | 5/2006 | Moon ........................... | 345/100 |
| 7,317,779 B2 * | 1/2008 | Moon et al. .................... | 377/64 |
| 7,369,111 B2 * | 5/2008 | Jeon et al. ..................... | 345/100 |
| 7,696,974 B2 * | 4/2010 | Moon et al. .................... | 345/100 |
| 2005/0201508 A1 * | 9/2005 | Shin et al. ....................... | 377/10 |
| 2005/0220262 A1 * | 10/2005 | Moon ............................. | 377/64 |

* cited by examiner

*Primary Examiner* — Tuan T Lam

(74) *Attorney, Agent, or Firm* — Altis Law Group, Inc.

(57) ABSTRACT

An exemplary shift register includes a plurality of shift register units, each of which includes an output circuit, an input circuit, and a logic circuit. The output circuit includes a clock transistor, a voltage stabilizing transistor, and an input circuit for receiving signals output by a previous shift register unit. The logic circuit receives signals output by the input circuit. When the input circuit outputs signals to switch on the clock transistor, the logic circuit outputs a low level voltage signal to shut off the voltage stabilizing transistor. Thus, the output circuit outputs signals via the clock circuit. On the other hand, when the input circuit outputs signals to shut off the clock transistor, the logic circuit outputs a high level voltage signal to turn on the voltage stabilizing transistor, so as to maintain the output circuit to output low level voltage signal.

14 Claims, 4 Drawing Sheets

SHIFT REGISTER AND LIQUID CRYSTAL DISPLAY USING SAME

FIELD OF THE INVENTION

Embodiments of the present disclosure relate to a shift register, and more particularly to a shift register in a liquid crystal display (LCD).

GENERAL BACKGROUND

Shift registers are core circuit units of integrated circuits that are used in products such as thin film transistor liquid crystal displays (TFT-LCDs). A shift register provides sequential pulse signals to scanning lines of a TFT-LCD, so as to control on and off states of TFTs connected to the scanning lines.

Referring to FIG. 5, one such shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal VS from a pre-stage shift register unit (not shown). The output signal VS functions as a start signal.

The first clock inversion circuit 110 includes a first transistor P1, a second transistor P2, a third transistor P3, a fourth transistor P4, a first output V1, and a second output V2. The inverter 120 includes a fifth transistor P5 and a sixth transistor P6. The inverter 120 outputs an output signal that serves as a shift register signal V. The second clock inversion circuit 130 and the first clock inversion circuit 120 have similar structures. The second clock inversion circuit 130 includes a seventh transistor P7, an eighth transistor P8, a ninth transistor P9, and a tenth transistor P10.

Referring to FIG. 6, a sequence waveform diagram of pulse signals of the shift register unit 100 is shown. During a period t1, the inverter 120 and the second clock inversion circuit 130 perform a latch operation. During the latch operation, the sixth transistor P6 is switched off such that the shift register signal V of the inverter 120 keeps an original state of the previous stage. During a period t2, no latch operation is performed. The start signal VS is applied to the inverter 120, and the second clock inversion circuit 130 keeps the same state as the start signal VS. Furthermore, the first transistor P1 is switched on because the start signal VS jumps to a low voltage, such that the fifth transistor P5 is switched off and the sixth transistor P6 is switched on. Thus, the inverter 120 outputs the shift register signal V having a low level through the activated sixth transistor P6. During a period t3, the inverter 120 and the second clock inversion circuit 130 perform latch operation. The inverter 120 maintains output of a low level shift register signal V through the activated sixth transistor P6. During a period t4, no latch operation is performed. The inverter 120 stops output of the low-level shift register signal V.

However, the shift register unit 100 receives the start signal VS during period t2, and at the same time, outputs the shirt register signal V. These two signals VS, V may liable to overlap during period t2. That is, in the LCD that taking the shift register units 100 as gate or data driving circuits, two rows or columns of the gate/data lines may be scanned at the same time. Therefore, it may cause signal distortions, which may cause color shift while displaying images on the LCD.

What is needed, therefore, is a shift register which can overcome the above-described deficiencies. What is also needed is an LCD device including the shift register.

SUMMARY

A shift register includes a plurality of shift register units, and each two adjacent shift register units receives two inverse clock signals. Each of the shift register unit includes an output circuit, and input circuit, and a logic circuit. The output circuit receives a clock signal from an external circuit, which includes a clock transistor for receiving the clock signal; and a voltage stabilizing transistor for receiving a low level voltage signal. The input circuit receives signals output by a previous shift register unit and outputs signals to turn on the clock transistor. The logic circuit receives a high level voltage signal, a low level voltage signal, and signals output by the input circuit, to control the logic circuit to output a high level voltage signal or a low level voltage signal to the voltage stabilizing transistor. When the input circuit outputs signals to switch on the clock transistor, the logic circuit outputs a low level voltage signal to shut off the voltage stabilizing transistor. Thus, the output circuit outputs signals via the clock circuit. On the other hand, when the input circuit outputs signals to shut off the clock transistor, the logic circuit outputs a high level voltage signal to turn on the voltage stabilizing transistor, so as to maintain the output circuit to output low level voltage signal.

A liquid crystal display includes a liquid crystal panel, a gate driving circuit, and a data driving circuit. Each of the gate driving circuit and the data driving circuit includes at least one shift register, and each of the shift registers includes a plurality of shift register units connected in stages. Further, each two adjacent shift register units receives two inverse clock signals. Each of the shift register unit includes an output circuit, and input circuit, and a logic circuit. The output circuit receives a clock signal from an external circuit, which includes a clock transistor for receiving the clock signal; and a voltage stabilizing transistor for receiving a low level voltage signal. The input circuit receives signals output by a previous shift register unit and outputs signals to turn on the clock transistor. The logic circuit receives a high level voltage signal, a low level voltage signal, and signals output by the input circuit, to control the logic circuit to output a high level voltage signal or a low level voltage signal to the voltage stabilizing transistor. When the input circuit outputs signals to switch on the clock transistor, the logic circuit outputs a low level voltage signal to shut off the voltage stabilizing transistor. Thus, the output circuit outputs signals via the clock circuit. On the other hand, when the input circuit outputs signals to shut off the clock transistor, the logic circuit outputs a high level voltage signal to turn on the voltage stabilizing transistor, so as to maintain the output circuit to output low level voltage signal.

Other novel features and advantages will become more apparent from the following detailed description when taken in conjunction with the accompanying drawings.

DETAILED DESCRIPTION OF CERTAIN INVENTIVE EMBODIMENTS

Figure 1:
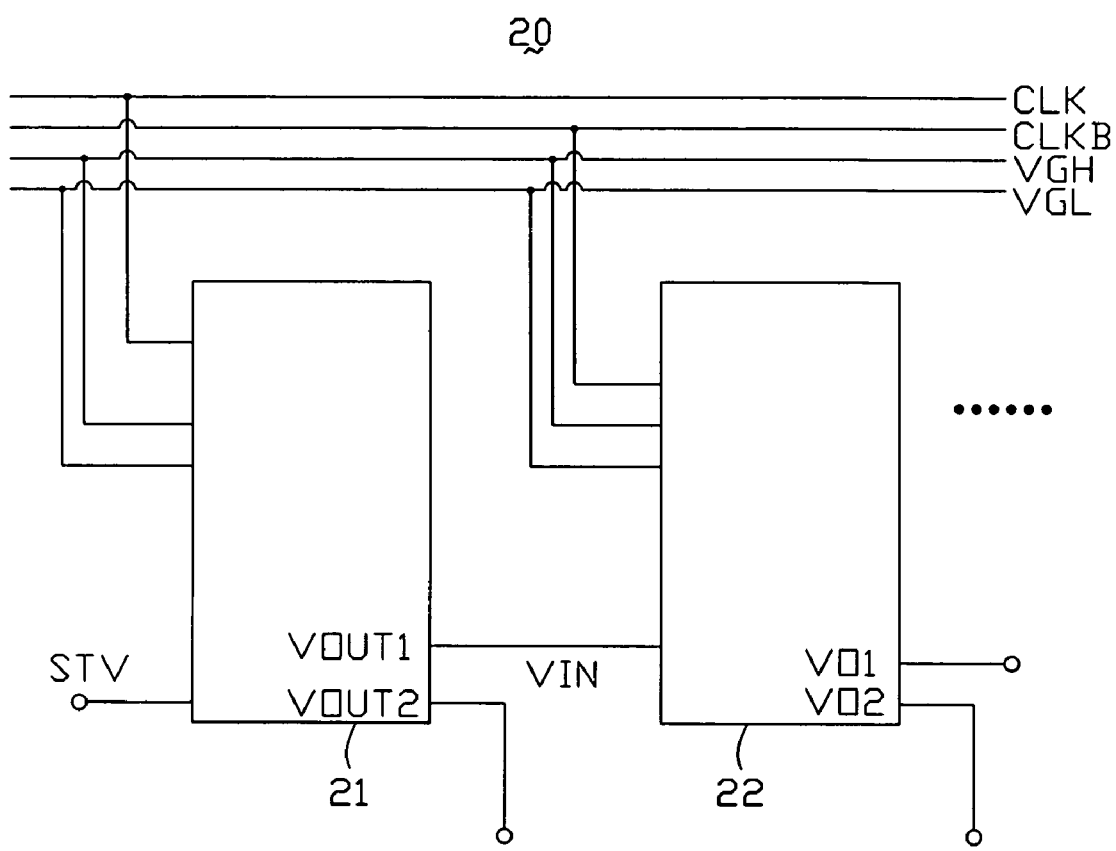
FIG. 1 illustrates a circuit diagram of one embodiment of a shift register of the present disclosure including a plurality of shift register units.

FIG. 1 illustrates a circuit diagram of one embodiment of a shift register 20 of the present disclosure including a plurality of shift register units 21, 22. The shift register units 21, 22 are connected in series, and each of which receives a first clock signal CLK, a second clock signal CLKB inverse to the first clock signal CLK, a high level voltage signal VGH, and a low level voltage signal VGL. Each shift register unit 21 includes a plurality of NMOS (N-channel metal oxide semiconductor) transistors, and each NMOS transistor includes a gate, a source, and a drain. The shift register units 21 includes an input STV, a first output VOUT1, and a second VOUT2. Further, the shift register unit 22 includes an input VIN, a first output VO1, and a second output VO2. Signals output by the first output VOUT1 of the shift register unit 21 are transmitted to the input VIN of the shift register unit 22, and signals output by the first output VO1 and the second output VO2 of the shift register unit 22 may feedback to the shift register unit 21. The second output VOUT2 of the shift register unit 21 and the second output VO2 of the shift register unit 22 serve to output to an external circuit (not shown).

Figure 2:
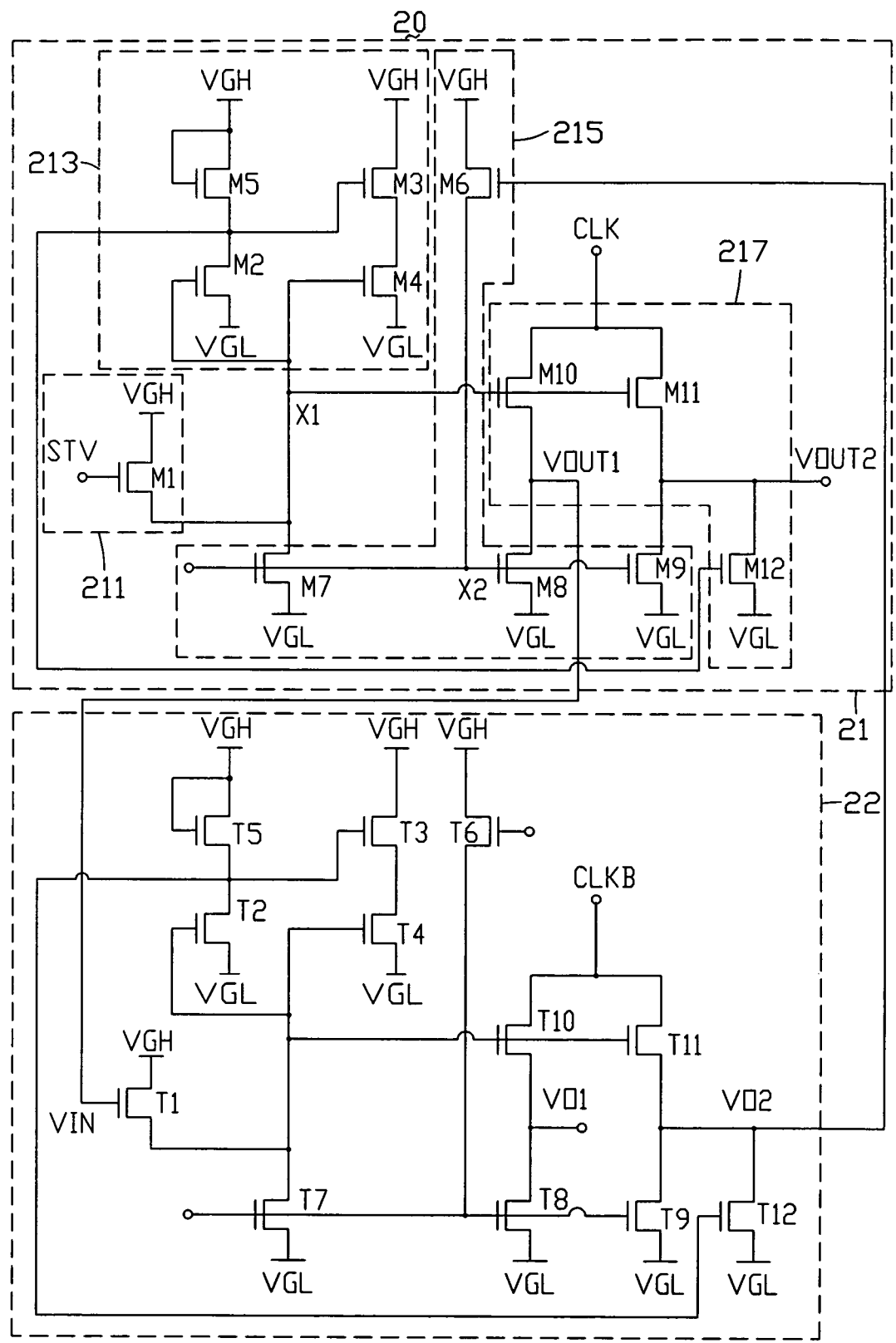
FIG. 2 illustrates a low-level schematic diagram of one embodiment of the shift register unit of FIG. 1.

FIG. 2 illustrates a low-level schematic diagram of one embodiment of the shift register units 21, 22. The shift register unit 21 includes an input circuit 211, a logic circuit 213, a feedback circuit 215, an output circuit 217, and a first node X1. The input circuit 211, the logic circuit 213, and the output circuit 217 are coupled to the first node X1.

The input circuit 211 includes a first transistor M1. A drain of the first transistor M1 receives the high level voyage signal VGH, and a gate of the first transistor M1 serves as an input STV of the first shift register unit 21. Further, a source of the first transistor M1 is connected to the node X1.

The logic circuit 213 includes a second transistor M2, a third transistor M3, a fourth transistor M4, and a fifth transistor M5. A source of the second transistor M2 receives the low level voltage signal VGL, and a gate of the second transistor M2 is connected to a gate of the fourth transistor M4. The gates of the second and fourth transistors M2, M4 are connected to the first node X1. Further, a drain of the second transistor M2 is connected to sources of the fifth transistors M5. A source of the fourth transistor M4 receives the low level voltage signal VGL, and a drain of the fourth transistor M4 is connected to a source of the third transistor M3. A gate of the third transistor M3 is connected to the drain of the second transistor M2, and a drain of the third transistor M3 receives the high level voltage signal VGH. A gate and a drain of the fifth transistor M5 is connected with each other, for receiving the high level voltage signal VGH.

The feedback input 215 includes a sixth transistor M6, a seventh transistor M7, an eighth transistor M8, a ninth transistor M9, and a second node X2. A gate of the sixth transistor M6 receives signals output from the second shift register unit 22, and a drain of the sixth transistor M6 receives the high level voltage signal VGH. Further, a source of the sixth transistor M6 is connected to second node X2. A gate of the seventh transistor M7 is connected to the second node X2, and a source of the seventh transistor M7 receives the low level voltage signal VGL. Further, a drain of the seventh transistor M7 is connected to the node X1. Gates of the eighth and ninth transistors M8, M9 are connected to the second node X2, and sources of the eighth and ninth transistors M8, M9 receives the low level input VGL. Further, drains of the eighth and ninth transistors M8, M9 are connected to the output circuit 217.

The output circuit 217 includes a tenth transistor M10, an eleventh transistor M11, and a twelfth transistor M12. The tenth and eleventh transistors M10, M11 serve as clock transistors of the output circuit 217. Gates of the tenth and eleventh transistors M10, M11 are connected to the first node X1, and drains of the ninth and tenth transistors M9, M10 are connected to the first clock signal CLK. Further, sources of the tenth and eleventh transistors M10, M11 are respectively connected to the drains of the eighth and ninth transistors M8, M9, and serve as the first output VOUT1 and the second output VOUT2, respectively. Signals output by the first output VOUT1 are transmitted to the input VIN of the second shift register unit 22, and signals output by the second output VOUT2 are transmitted to an external circuit. The twelfth transistor M12 serves as a voltage stabilizing transistor, and a gate of the twelfth transistor M12 is connected to the source of the fifth transistor M5 of the logic circuit 213. A source of the twelfth transistor M12 receives the low level voltage signal VGL, and a drain of the twelfth transistor M12 is connected to the second output VOUT2.

The second shift register unit 22 has an arrangement similar to that of the first shift register unit 21. The second shift register unit 22 includes twelve transistors T1~T12, an input VIN, a first output VO1, and a second output VO2. The input VIN receives signals output by the first output VOUT1 of the first shift register unit 21, and the first output VO1 is connected to the gate of the sixth transistor M6 of the first shift register unit 21. Drains of the tenth transistor T10 and the twelfth transistor T12 are connected to the second clock signal CLKB.

Figure 3:
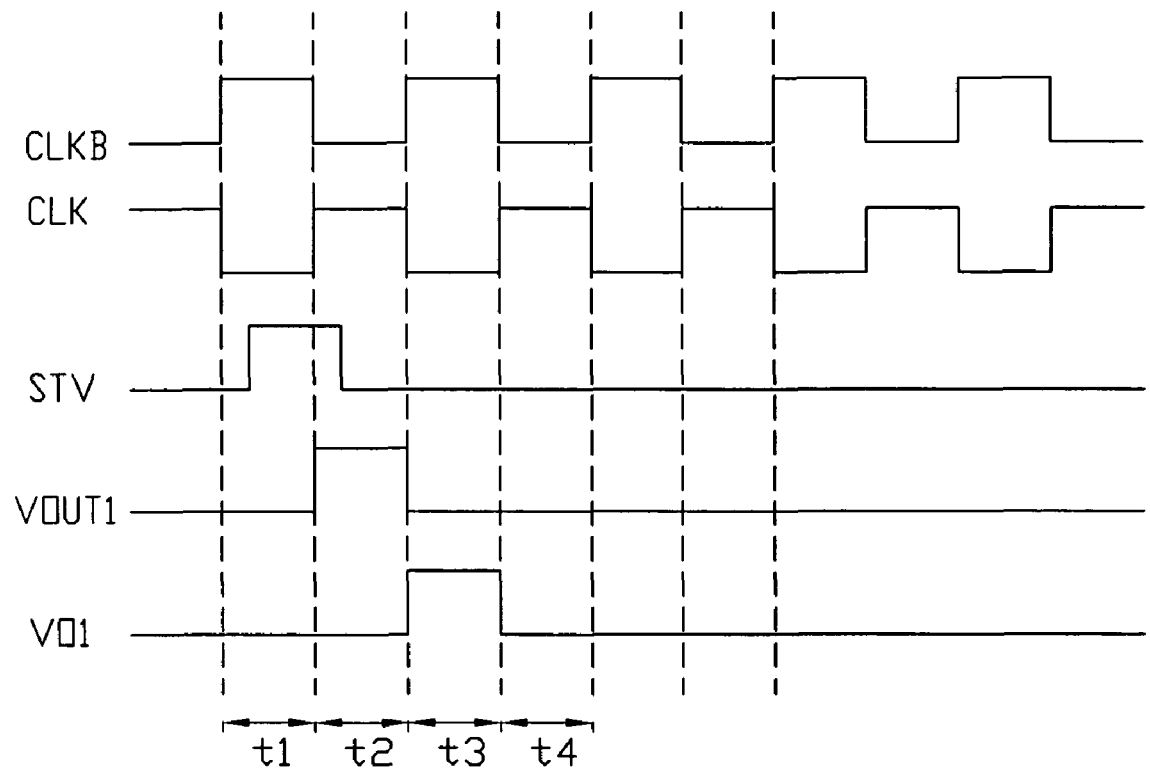
FIG. 3 illustrates a sequence waveform diagram of exemplary pulse signals of the shift register unit of FIG. 1.

FIG. 3 illustrates a sequence waveform diagram of exemplary pulse signals of the shift register units 21, 22 of FIG. 1. During the period t1, the first clock signal CLK is set at a low level voltage signal VGL, and the second clock signal CLKB is set at a high level voltage signal VGH. Further, the start input STV turns from a low level voltage signal VGL to a high level voltage signal VGH during the period t1.

In the first shift register unit 21, the first transistor M1 of the input circuit 211 is switched off, so as to maintain the first node X1 at a low level. Then, the tenth and eleventh transistors M10, M11 of the output circuit 217 are switched off. The first clock signal CLK cannot output to the first output VOUT1, and the first output VOUT1 is kept as a low level. At the same time, the second and fourth transistors M2, M4 of the logic circuit 213 are switched off, and cannot receive the low level voltage signal VGL. The fifth transistor M5 of the logic circuit 213 is switched on due to that the gate and drain of which receive the high level voltage signal VGH, and cause the twelfth transistor M12 to be switched on. The second output VOUT2 of the first shift register 21 outputs low level voltage signal VGL to the external circuit.

During the period t1, the second shift register unit 22 receives the second clock signal CLKB at a low level voltage signal VGL. The input VIN of the second shift register unit 22 receives the signals output by the first shift register unit 21, and the signals are maintained at a low level voltage signal VGL. Then, the first, the ninth, and the tenth transistors T1, T9, T10 are all switched off. The first and second outputs VO1, VO2 respectively output the low level signal VGL. At the same time, the second and fourth transistors T2, T4 are switched off, and the fifth transistor T5 is switched on via receiving the high level signal VGH. The second clock signal CLKB at high level VGH are transmitted to twelfth transistor T12 via the fifth transistor T5, so as to make the low level signal VGL to be transmitted to the first and second outputs VO1, VO2. Therefore, the first and second outputs VO1, VO2 respectively maintain to output the low level voltage signal VGL. The low level voltage signal VGL output by the second output VO2 is feedback to the gate of the sixth transistor M6, so as to switch off the sixth transistor M6. Then, the seventh, the eighth, and the ninth transistors M7, M8, M9 of the feedback circuit 215 are switched off.

After that, when signals input to the input STV turns from a low level voltage signal VGL to a high level voltage signal VGH, the first transistor M1 is switched on, and the input circuit 211 outputs the high level voltage signal VGH to the first node X1 via the first transistor M1. Then, the tenth and eleventh transistors M10 and M11 are switched on, and the first and second outputs VOUT1, VOUT2 respectively outputs the first clock signal CLK. That is, the first output VOUT1 outputs the low level voltage signal VGL to the second shift register unit 22, and the second output VOUT2 outputs the low level voltage signal VGL to the external circuit. At the same time, the second and fourth transistors M2, M4 connected to the first node X1 are also switched on, so as to pull down a voltage level of the source of the fifth transistor M5 to a low level voltage signal. Then, the twelfth transistor M12 is switched off, and the second output VOUT2 maintains to output the first clock signal CLK. Meanwhile, the first and second outputs VO1, VO2 respectively maintain to output the low level voltage signal VGL.

During a period t2, the first clock signal CLK turns to a high level voltage signal VGH, and the second clock signal CLKB turns to a low level voltage signal VGL. Further, the start signal STV turns from a high level voltage signal VGH to a low level voltage signal VGL during the period t2.

In the first shift register unit 21, the input circuit 211 outputs the high level voltage signal VGH to the first node X1. Then, the tenth and eleventh transistors M10, M11 are switched on. Therefore, the first output VOUT1 of the output circuit 217 outputs the first clock signal CLK (the high level voltage signal VGH) to the second shift register unit 22, and the second output VOUT2 of the output circuit 217 outputs the first clock signal CLK (the high level voltage signal VGH) to the external circuit (not shown), so as to pull up the voltage level of the node X1. At the same time, the second transistor M2 is switched on and the source of the fifth transistor M5 is kept at a low level. Then, the twelfth transistor M12 is switched off, and the second output VOUT2 maintains to output the first clock signal CLK (the high level voltage signal VGH) to the external circuit (not shown).

During the period t2, the second shift register unit 22 receives the second clock signal CLKB at a low level voltage signal VGL. The input VIN of the second shift register unit 22 receives the signals output by the first shift register unit 21, and the signals are maintained at a high level voltage signal VGH. Then, the first transistor T1 is switched on to output the high level voltage signal VGH to the tenth and eleventh transistors T10, T11. The first and second outputs VO1, VO2 respectively output the second clock signal CLKB at a low level voltage signal VGL. Meanwhile, the twelfth transistor T12 is switched off to maintain the second output VO2 to output the second clock signal CLKB (the low level voltage signal VGL) to the external circuit and feedback the second clock signal CLKB to the first shift register unit 21 and the gate of the sixth transistor M6. The sixth transistor M6 is switched off so as to shut off the seventh, eighth, and night transistors T7, T8, T9.

After that, when signals input to the input STV of the first shift register unit 21 turns from a high level voltage signal VGH to a low level voltage signal VGH, the first transistor M1 is switched off. That is, the first node X1 maintains at a high level. The first and second outputs VOUT1, VOUT2 maintains to output the high level voltage signal VGH, and the twelfth transistor M12 is still shut off. That is, the signals received by the second shift register unit 22 is not varied, and the first and second outputs VO1, VO2 maintain to output the second clock signal CLKB.

During the period t3, the input STV keeps to receive the low level voltage signal VGL, the first clock signal CLK is at a low level, and the second clock signal CLKB is at a high level.

In the first shift register unit 21, the first transistor M1 is switched off, and the first node X1 is maintained at a high level. The tenth and eleventh transistors M10, M11 are switched on. The first and second outputs VOUT1, VOUT2 of the output circuit 217 output the low level voltage signal VGL.

At the same time, the second shift register unit 22 receives the second clock signal CLKB at a high level voltage signal VGH. The input VIN of the second shift register unit 22 receives the signals output by the first shift register unit 21, and the signals are maintained at a low level voltage signal VGL. Then, the first transistor T1 is switched off, and the tenth and eleventh transistors T10, T11 are all switched on. The first and second outputs VO1, VO2 respectively output the second clock signal CLKB at a high level voltage signal VGH. At the same time, the output VO2 outputs the high level voltage signal VGH to the external circuit and feedback the high level voltage signal VGH to the sixth transistor M6 of the first shift register unit 21. The six transistor M6 is switched on, which receives the high level signal to switch on the seventh, eighth, and ninth transistors M7, M8, M9. Therefore, the seventh, eighth, and ninth transistors M7, M8, M9 receive the low level voltage signal VGL, so as to pull down the voltage level of the first node X1, the first and second outputs VOUT1, VOUT2. Then, the tenth and eleventh transistors M10, M11 are switched off, and the second transistor M2 is switched off. The fifth transistor M5 keeps to receive the high level voltage signal VGH, so as to switch on the twelfth transistor M12, to keep the second output VOUT2 to output low level voltage signal VGL.

After the period t3, the input STV of the first shift register unit 21 keeps to receive the low level voltage signal VGL, and the first node X1 is kept at a low level. Then, the tenth and eleventh transistors M10, M11 are switched off. The first clock signal CLK cannot output via the tenth and eleventh transistors M10, M11. Moreover, the first transistor M5 is switched on, so as to output the high level voltage signal VGH to switch on the twelfth transistor M12, for keeping the second output VOUT2 to output the low level voltage signal VGL.

According to the operation sequence, the tenth and eleventh transistors T10, T11 of the second shift register unit 22 are switched on while the tenth and eleventh transistors M10, M11 of the first shift register unit 21 are switched on, and the first clock signal CLK and the second clock signal CLKB are reversed, and periodically varied. Therefore, the signals output by the first and second shift register units 21, 22 are not overlapped with each other. Moreover, the second shift register unit 22 may feedback the high level voltage signal VGH to the first shift register unit 21 via the feedback circuit 215, to reset the first shift register unit 21, so as to keep the first shift register unit 21 to output a low level voltage signal from the twelfth transistor M12.

Therefore, the adjacent shift register units may not cause signal distortions between adjacent shift register units due to overlapping adjacent shift register signals. As a result, the shift register unit 21 is liable to be stable.

Figure 4:
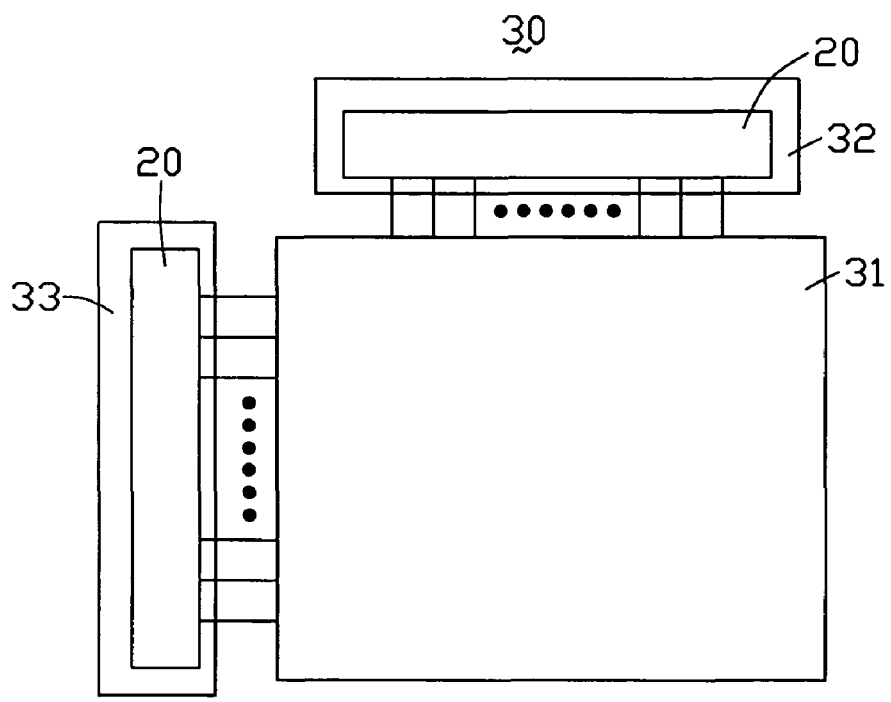
FIG. 4 illustrates one embodiment of a liquid crystal display employing at least one of the shift registers of FIG. 1.
Figure 5:
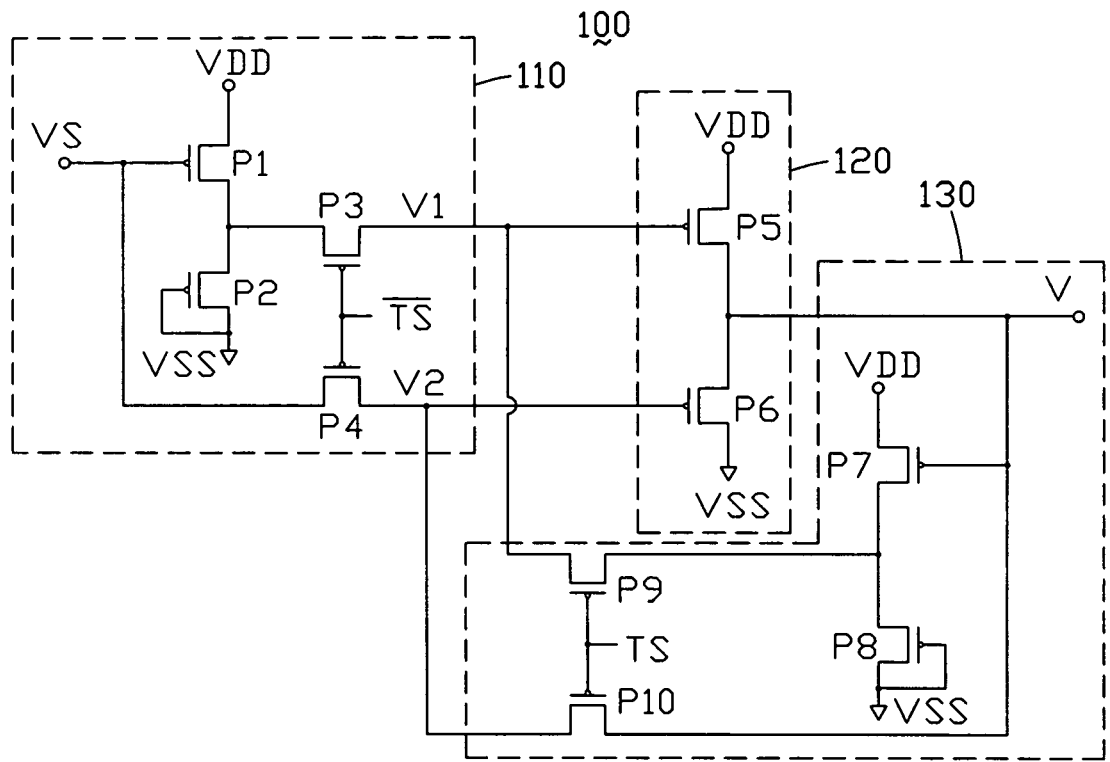
FIG. 5 is a circuit diagram of a shift register unit of a conventional shift register.
Figure 6:
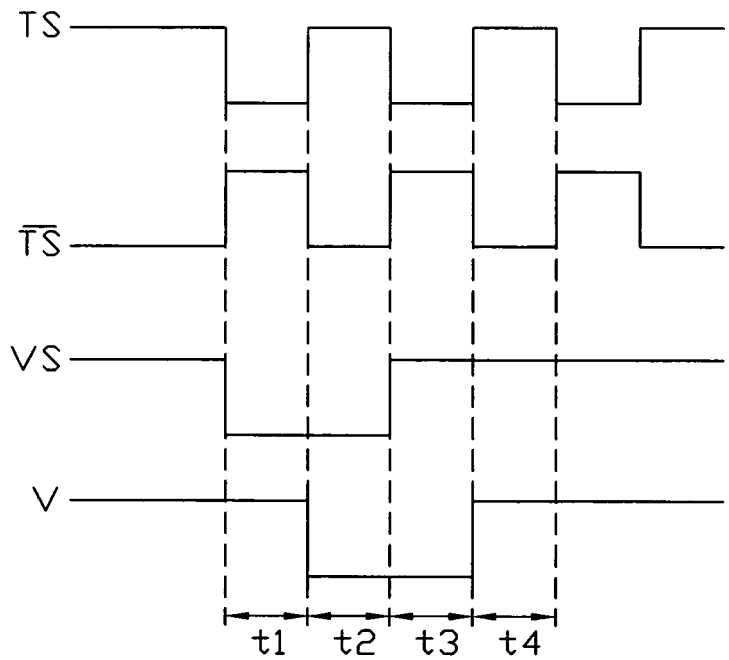
FIG. 6 is a sequence waveform diagram of pulse signals of the shift register of FIG. 5.

Referring to FIG. 4, a liquid crystal display employing the shift registers 20 is shown. The liquid crystal display 30 includes a liquid crystal display panel 31, a data driving circuit 32, and a gate driving circuit 33. Both the gate and data driving circuits 33, 32 install shift registers 20 to control output sequence of the gate driving signals and data signals, so as to control the images displayed by the liquid crystal display 30.

Accordingly, the liquid crystal display 30 employing the shift register 20 may not have a distorted display quality because adjacent scanning lines corresponding to adjacent columns or rows of TFTs may be scanned simultaneously by the shift register pulse signals instead of being scanned sequentially.

It is to be further understood that even though numerous characteristics and advantages of the present inventive embodiments have been set out in the foregoing description, together with details of the structures and functions of the embodiments, the disclosure is illustrative only, and that changes may be made in detail, especially in matters of shape, size, and arrangement of parts within the principles of the present disclosure to the full extent indicated by the broad general meaning of the terms in which the appended claims are expressed.

What is claimed is:

1. A shift register, comprising:
a plurality of shift register units, each two adjacent shift register units receiving two inverse clock signals, each of the shift register unit comprising:
an output circuit receiving a clock signal from an external circuit, the output circuit comprising a clock transistor receiving the clock signal; and a voltage stabilizing transistor receiving a low level voltage signal; and
an input circuit receiving signals output by a previous shift register unit and outputting signals to switch on the clock transistor; and
a logic circuit receiving a high level voltage signal and a low level voltage signal, and receiving signals output by the input circuit, to control the logic circuit to output the high level voltage signal or the low level voltage signal to the voltage stabilizing transistor;
wherein the input circuit, the logic circuit, and the output circuit are coupled to a first node, when the input circuit outputs signals to switch on the clock transistor, the logic circuit outputs the low level voltage signal to shut off the voltage stabilizing transistor, the output circuit outputs signals via the clock transistor; whereas when the input circuit output signals to shut off the clock transistor, the logic circuit outputs the high level voltage signal to turn on the voltage stabilizing transistor, so as to maintain the output circuit to output the low level voltage signal;
wherein the input circuit comprises a first transistor, a drain of the first transistor is connected to the external circuit and receives the high level voltage signal, a gate of the first transistor receives signals output by the previous shift register unit, and a source of the first transistor is connected to the first node;
wherein the logic circuit comprises a second, a third, a fourth, and a fifth transistor, gates of the second and fourth transistors are connected to the first node, a source of the second transistor receives the low level voltage signal from the external circuit, a drain of the second transistor is connected to a source of the fifth transistors a source of the fourth transistor receives the low level voltage signal from the external circuit, a drain of the fourth transistor is connected to a source of the third transistor, a gate of the third transistor is connected to the drain of the second transistor, a drain of the third transistor receives the low level voltage signal from the external circuit, and a gate and a drain of the fifth transistor are connected with each other for receiving the high level voltage signal;
wherein the shift register unit further comprises a feedback circuit, the feedback circuit receives signals output by a next adjacent shift register unit to reset the shift register unit, the feedback circuit comprises a sixth transistor, a seventh transistor, an eighth transistor, a ninth transistor, and a second node; a gate of the sixth transistor receives the signals output by the next shift register unit, a drain of the sixth transistor receives the high level voltage signal from the external circuit, a source of the six transistor is connected to the second node; a gate of the seventh transistor is connected to the second node, a source of the seventh transistor receives the low level voltage signal from the external circuit, a drain of the seventh transistor is connected to the first node; gates of the eighth and ninth transistors are connected to the second node, sources of the eighth and ninth transistors receive the low level voltage signal from the external circuit, and drains of the eighth and ninth transistors are connected to the output circuit.

2. The shift register of claim 1, wherein each transistor of the shift register unit is an N-channel metal oxide semiconductor transistor.

3. The shift register of claim 1, wherein the clock transistor comprises a tenth transistor and an eleventh transistor, gates of the tenth and eleventh transistors are connected to the first node, and drains of the tenth and eleventh transistors receive the clock signal, sources of the tenth and eleventh transistors are respectively connected to the drains of the eighth and ninth transistors, so as to respectively output signals to the next adjacent shift register unit and the external circuit.

4. The shift register of claim 3, wherein the voltage stabilizing transistor comprises a twelfth transistor, a gate of the twelfth transistor is connected to the source of the fifth transistor, a source of the twelfth transistor receives the low level voltage signal, and a drain of the twelfth transistor is connected to the drain of the ninth transistor, so as to output signals to the external circuit.

5. A liquid crystal display, comprising:
a liquid crystal panel;
a gate driving circuit; and
a data driving circuit;
wherein each of the gate driving circuit and the data driving circuit comprises at least one shift register, wherein each shift register comprises:
an output circuit receiving a clock signal from an external circuit, the output circuit comprising a clock transistor receiving the clock signal; and a voltage stabilizing transistor receiving a low level voltage signal; and
an input circuit receiving signals output by a previous shift register unit and outputting signals to switch on the clock transistor; and
a logic circuit receiving a high level voltage signal and the low level voltage signal, and receiving signals output by the input circuit, to control the logic circuit to output the high level voltage signal or the low level voltage signal to the voltage stabilizing transistor;
wherein when the input circuit outputs signals to switch on the clock transistor, the logic circuit outputs the low level voltage signal to shut off the voltage stabilizing transistor, the output circuit outputs signals via the clock transistor; whereas when the input circuit output signals to shut off the clock transistor, the logic circuit outputs the high level voltage signal to turn on the voltage stabilizing transistor, so as to maintain the output circuit to output the low level voltage signal;

wherein the output circuit, the input circuit and the logic circuit are connected to a first node, the shift register unit further comprises a feedback circuit, the feedback circuit receives signals output by a next adjacent shift register unit to reset the shift register unit, the feedback circuit comprises a first transistor, a second transistor, a third transistor, a fourth transistor, and a second node; a gate of the first transistor receives the signals output by the next shift register unit, a drain of the first transistor receives the high level voltage signal from the external circuit, and a source of the first transistor is connected to the second node; a gate of the second transistor is connected to the second node, a source of the second transistor receives the low level voltage signal from the external circuit, and a drain of the second transistor is connected to the first node; gates of the third and fourth transistors are connected to the second node, sources of the third and fourth transistors receive the low level voltage signal from the external circuit, and drains of the third and fourth transistors are connected to the output circuit.

6. The liquid crystal display of claim 5, wherein the input circuit comprises a fifth transistor, a drain of the fifth transistor is connected to the external circuit and receives the high level voltage signal, a gate of the fifth transistor receives signals output by the previous shift register unit, and a source of the fifth transistor is connected to the first node.

7. The liquid crystal display of claim 5, wherein the logic circuit comprise a fifth, a sixth, a seventh, and an eighth transistors; gates of the fifth and seventh transistors are connected to the first node, a source of the fifth transistor receives the low level voltage signal from the external circuit, a drain of the fifth transistor is connected to a source of the eighth transistor; a source of the seventh transistor receives the low level voltage signal from the external circuit, a drain of the seventh transistor is connected to a source of the sixth transistor; a gate of the sixth transistor is connected to the drain of the fifth transistor, a drain of the sixth transistor receives the high level voltage signal from the external circuit; and a gate and a drain of the eighth transistor are connected with each other for receiving the high level voltage signal.

8. The liquid crystal display of claim 7, wherein the voltage stabilizing transistor comprises a ninth transistor, a gate of the ninth transistor is connected to the source of the eighth transistor, a source of the ninth transistor receives the low level voltage signal, and a drain of the ninth transistor is connected to the drain of the fourth transistor, so as to output signals to the external circuit.

9. The liquid crystal display of claim 5, wherein the clock transistor comprises a fifth transistor and a sixth transistor, gates of the fifth and sixth transistors are connected to the first node, and drains of the fifth and sixth transistors receive the clock signal, sources of the fifth and sixth transistors are respectively connected to the drains of the third and fourth transistors, so as to respectively output signals to the next adjacent shift register unit and the external circuit.

10. A shift register, comprising:
a plurality of shift register units, each two adjacent shift register units receiving two inverse clock signals, each of the shift register unit comprising:

an output circuit receiving a clock signal from an external circuit, the output circuit comprising a clock transistor receiving the clock signal; and a voltage stabilizing transistor receiving a low level voltage signal; and an input circuit receiving signals output by a previous shift register unit and outputting signals to switch on the clock transistor; and a logic circuit receiving a high level voltage signal and the low level voltage signal, and receiving signals output by the input circuit, to control the logic circuit to output the high level voltage signal or the low level voltage signal to the voltage stabilizing transistor;

wherein when the input circuit outputs signals to switch on the clock transistor, the logic circuit outputs the low level voltage signal to shut off the voltage stabilizing transistor, the output circuit outputs signals via the clock transistor; whereas when the input circuit output signals to shut off the clock transistor, the logic circuit outputs the high level voltage signal to turn on the voltage stabilizing transistor, so as to maintain the output circuit to output the low level voltage signal;

wherein the output circuit, the input circuit and the logic circuit are coupled to a first node, the shift register unit further comprises a feedback circuit, the feedback circuit receives signals output by a next adjacent shift register unit to reset the shift register unit, the feedback circuit comprises a first transistor, a second transistor, a third transistor, a fourth transistor, and a second node; a gate of the first transistor receives the signals output by the next shift register unit, a drain of the first transistor receives the high level voltage signal from the external circuit, and a source of the first transistor is connected to the second node; a gate of the second transistor is connected to the second node, a source of the second transistor receives the low level voltage signal from the external circuit, and a drain of the second transistor is connected to the first node; gates of the third and fourth transistors are connected to the second node, sources of the third and fourth transistors receive the low level voltage signal from the external circuit, and drains of the third and fourth transistors are connected to the output circuit.

11. The shift register of claim 10, wherein the input circuit comprises a fifth transistor, a drain of the fifth transistor is connected to the external circuit and receives the high level voltage signal, a gate of the fifth transistor receives signals output by the previous shift register unit, and a source of the fifth transistor is connected to the first node.

12. The shift register of claim 10, wherein the logic circuit comprise a fifth, a sixth, a seventh, and an eighth transistors; gates of the fifth and seventh transistors are connected to the first node, a source of the fifth transistor receives the low level voltage signal from the external circuit, a drain of the fifth transistor is connected to a source of the eighth transistor; a source of the seventh transistor receives the low level voltage signal from the external circuit, a drain of the seventh transistor is connected to a source of the sixth transistor; a gate of the sixth transistor is connected to the drain of the fifth transistor, a drain of the sixth transistor receives the high level voltage signal from the external circuit; and a gate and a drain of the eighth transistor are connected with each other for receiving the high level voltage signal.

13. The shift register of claim 12, wherein the voltage stabilizing transistor comprises a ninth transistor, a gate of the ninth transistor is connected to the source of the eighth transistor, a source of the ninth transistor receives the low level voltage signal, and a drain of the ninth transistor is connected to the drain of the fourth transistor, so as to output signals to the external circuit.

14. The shift register of claim 10, wherein the clock transistor comprises a fifth transistor and a sixth transistor, gates of the fifth and sixth transistors are connected to the first node, and drains of the fifth and sixth transistors receive the clock signal, sources of the fifth and sixth transistors are respectively connected to the drains of the third and fourth transistors, so as to respectively output signals to the next adjacent shift register unit and the external circuit.

* * * * *